US000001471H

United States Statutory Invention Registration [19]

[11] Reg. Number: H1471

Braun et al.

[43] Published: Aug. 1, 1995

[54] METAL SUBSTRATE DOUBLE SIDED CIRCUIT BOARD

[76] Inventors: David J. Braun, 407 E. 5th St., St. Charles, Minn. 55972; Charles J. Guenther, 2605 25th St. NW.; James A. Hagan, 4021 17th Ave. NW., both of Rochester, Minn. 55901; Mark K. Hoffmeyer, 2905 Shadow Dr. SE., Rochester, Minn. 55904; Steven D. Keidl, 6422 16th Ave. NW., Rochester, Minn. 55901; Timothy C. Daun-Lindberg, 3123 Crescent La. NW., Rochester, Minn. 55901; John G. Stephanie, 1117 20th St. NW., Rochester, Minn. 55901; Vincent W. Ting, 1807-4A Greenfield La. SW., Rochester, Minn. 55902

[21] Appl. No.: 53,933

[22] Filed: Apr. 26, 1993

[51] Int. Cl.[6] ..... H02B 1/56; H05K 7/20

[52] U.S. Cl. ..... 361/704; 361/688

[58] Field of Search ..... 174/16.3, 252, 262–263, 174/265; 361/386–389, 397, 410, 414

[56] References Cited

U.S. PATENT DOCUMENTS

| | | | |
|---|---|---|---|
| 3,334,395 | 8/1967 | Cook et al. | 174/252 |
| 3,573,707 | 4/1971 | Reynolds | 174/252 |
| 3,654,583 | 4/1972 | Mancini | 174/263 |
| 3,873,756 | 3/1975 | Gall et al. | 174/262 |
| 3,932,932 | 1/1976 | Goodman | 361/414 |
| 4,675,788 | 6/1987 | Breitling et al. | 361/414 |
| 4,711,822 | 12/1987 | Choyke et al. . | |
| 4,963,414 | 10/1990 | LeVasseur et al. | 174/252 |
| 4,963,697 | 10/1990 | Peterson et al. . | |
| 4,979,074 | 12/1990 | Morley et al. | 361/387 |
| 5,031,072 | 7/1991 | Malhi et al. | 361/387 |
| 5,045,642 | 9/1991 | Ohta et al. . | |
| 5,072,075 | 12/1991 | Lee et al. . | |
| 5,098,533 | 3/1992 | Duke et al. . | |
| 5,121,299 | 6/1992 | Frankeny et al. . | |

FOREIGN PATENT DOCUMENTS

| | | | |
|---|---|---|---|
| 2743647 | 3/1979 | Germany | 361/387 |

*Primary Examiner*—Bernarr E. Gregory

[57] ABSTRACT

Disclosed is a circuit board and a process for the manufacture thereof providing a circuit board comprising a metal core having parallel first and second major faces and exhibiting high thermal and electrical conductivity. The circuit board includes electrical insulating layers of thermally conductive, dielectric material applied to the first and second major faces of the metal core. Protecting the dielectric layer and copper conductors is a solder mask layer applied to the dielectric layers and forming outward facing major surfaces. A plurality of insulated and grounded vias having electrically conductive interior rings connecting the major surfaces are provided through the board. Conductive sleeves within the vias are either electrically insulated from the metal core by dielectric material or in electrical contact to the metal core for grounding.

6 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METAL SUBSTRATE DOUBLE SIDED CIRCUIT BOARD

BACKGROUND OF THE INVENTION

1. Technical Field

The invention relates to electronic circuit boards and more particularly to multi-layer circuit boards exhibiting high thermal conductivity for heat dissipation and providing for double sided mounting of circuit elements to achieve high circuit element volumetric density.

2. Description of the Related Art

Contemporary electronic circuits are conventionally fabricated by mounting circuit elements and integrated circuit packages on circuit cards or boards. The boards electrically interconnect the various passive and active circuit elements and integrated circuit packages into one or more functional units. Conventional multi-layer boards are manufactured by laminating together layers of, for example, glass reinforced epoxy, and have copper conductors affixed to one or more major surfaces of the board. Circuit elements may then be attached to the conductors to complete the device.

While laminate boards composed of non-thermally conductive materials are suitable for many low density applications, such boards are less than optimum for application to power supplies and other applications having a high density of circuit elements. Power supplies are often rated on the basis of watts per unit volume. Components such as transformers and filters can be reduced in size if operating frequency is increased. Higher operating frequencies though place a premium on short, low inductance connections between circuit elements. It is also preferable if use of both sides of a circuit board for support of devices is allowed. In this way the smaller devices are brought physically closer together. However, reduced size reduces the surface area of the device from which to radiate heat. Close physical proximity to other heat generating devices complicates the heat dissipation process. As a consequence, heat removal, which is already a problem for boards used for power supplies, promises to become still more difficult as operating frequencies are increased from the 50 to 200 kilohertz range to ranges in excess of 1 Megahertz.

The use of insulated metal core circuit boards to increase heat dissipation is known. Although high thermal conductivity to the metal core is also known, it has been limited to use on single sided boards.

SUMMARY OF THE INVENTION

It is an object of the invention to provide an improved circuit board.

It is another object of the invention to provide high circuit element volumetric density.

It is still another object of the invention to provide a circuit board exhibiting high thermal conductivity for heat dissipation.

It is another object of the invention to provide said circuit board allowing two sided mounting of devices.

The invention provides a circuit board comprising a metal core having parallel first and second major faces and exhibiting high thermal and electrical conductivity through the core. The circuit board includes electrical insulating layers of thermally conductive, dielectric material applied to first and second major faces of the metal core. Protecting the surfaces of the circuit board is a solder mask layer applied on top of the Cu circuitization and dielectric layers that form outward facing major surfaces. A plurality of insulated and grounded vias having electrically conductive interior rings connecting the circuit layers are provided through the board. Conductive sleeves within the vias are either electrically insulated from the metal core by dielectric material or in electrical contact to the metal core for grounding.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
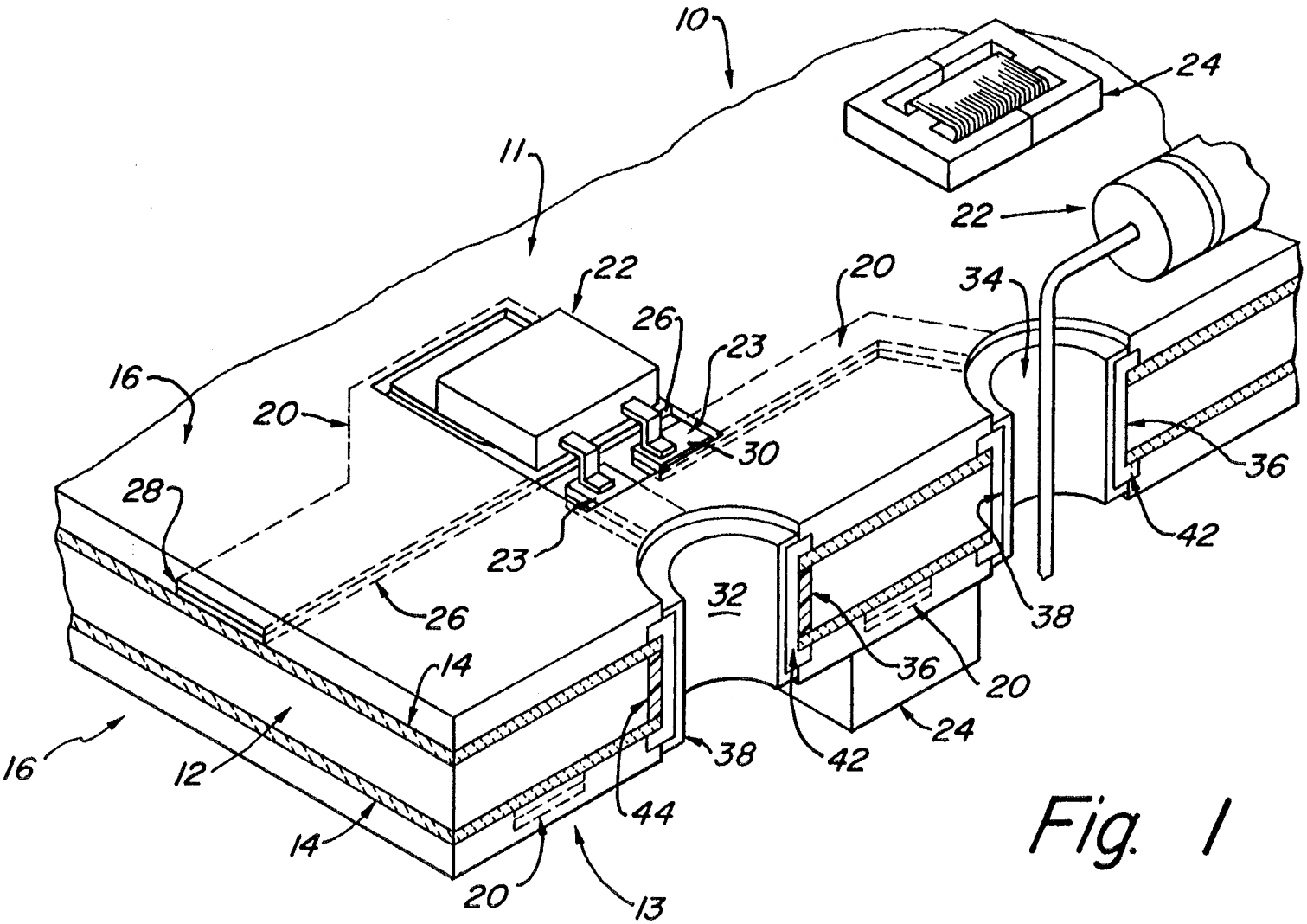
FIG. 1 is a perspective section view of a metal core circuit board with vias supporting devices on both major surfaces.

With reference now to the figures and in particular with reference to FIG. 1, there is depicted a double sided circuit board 10, possessing parallel major faces 11 and 13. Circuit board 10 is constructed on a thermally and electrically conductive core 12. Core 12 is preferably copper, although other metals or metal laminates may also be used. Core 12 provides heat transfer and heat dissipation for devices mounted to board 10 and also serves as a circuit ground plane.

Dielectric layers 14, are applied to the parallel major surfaces of core 12. Dielectric layers 14 are made of thermally conductive material such as aluminum nitride (AIN), boron nitride (BN), diamond, diamond-like carbon, or ceramic polymer composite materials. The composite materials should be loaded with between 50% and 80% by volume of the thermally conductive ceramic material. The thickness of dielectric layers 14 depends upon the application of board 10 and the dielectric constant and voltage breakdown of the material used to construct the dielectric layers. Resting on the dielectric layers 14, below major faces 11 and 13, are a plurality of electrical leads 20, that are covered by protective solder mask layers 16. The solder mask layers provide for environmental protection of the board 10, the dielectric layers 14, and the electrical leads 20. Exposed areas of the electrical leads 20 not being covered by solder mask 16 form portions of major faces 11 and 13. Exposed portions of leads 20 provide mounting areas 23 for devices such as surface mounted integrated circuit packages 22, pin thru hole components, connectors, and other devices including transformers 24.

Dielectric layers 14, and electrical leads 20, are fabricated using combinations of lamination and plating methods, or combinations of various vapor deposition, plasma spray or sputtering technologies, and plating methods. When using a combination of lamination and plating methods, electrical leads 20, are built up in two layers, 26 and 28, with layer 26 formed on dielectric layer 14 being preferably composed of copper foil, and layer 28 being made of copper plating. When using vapor deposition, plasma spray or sputtering technologies, and plating processes for dielectric layers 14 and electrical leads 20, layer 26 on dielectric layer 14 is preferably a copper seed layer processed via sputter or vapor deposition technology, while layer 28 is processed via plating with copper as the preferred metal. Additional layers 30, comprised preferably of Au over Ni can also be added via plating to selected mounting areas 23, if required for component attach purposes such as wirebonding.

A plurality of vias are provided through circuit board 10, including insulated vias 32, and grounded vias 34. Insulated vias 32, include a bore 36, that provides for connection between electrical leads 20 on major faces 11 and 13. An electrically insulating liner 44 isolates via bore 36 from board core 12 and can be made from the materials that make up dielectric layers 14, or from epoxies, polyimides and other resins. Applied to liner 44 is a copper sleeve 42, that provides electrical connection to leads 20. A solder coating 38, may also be applied over the copper sleeve 42 if desired.

Grounded via 34, includes a bore 36, that allows for connection of electrical leads 20 to metal core 12. To provide an electrical pathway to ground from electrical leads 20 to metal core 12, a copper sleeve 42 is applied directly to the via wall of bore 36. A solder coating may also be applied over copper sleeve 42, if so desired.

Figure 2:
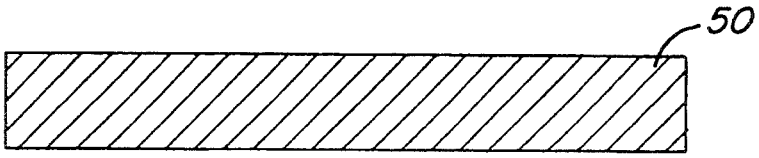
FIGS. 2–15 are a series of sectional views illustrating stages of fabrication of the high thermal conductivity circuit board of FIG. 1.

Turning next to FIG. 2, the first stage in the process for fabricating circuit board 10 is shown, beginning with a copper plate 50 having a thickness suitable for power dissipation. Typical ranges include 0.02 to 0 .08 inches which will form metal core 12 in the final product.

Figure 3:
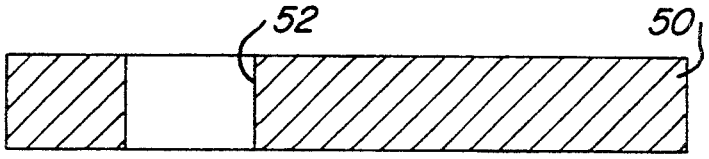

Referring to FIG. 3, clearance holes 52 for surface to surface connection vias (insulated vias 32) have been drilled in plate 50.

Figure 4:
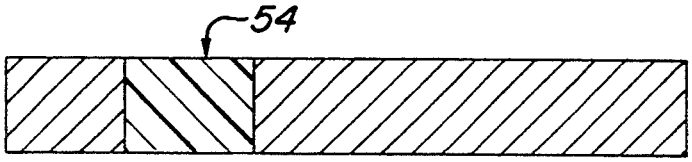

Next, in FIG. 4, clearance holes 52 have been filled with plugs 54 of hole fill compound. Plugs 54 may be non-thermally conductive or thermally conductive composite materials. This material can be the same material as in surface layer 14 or different.

Figure 5:
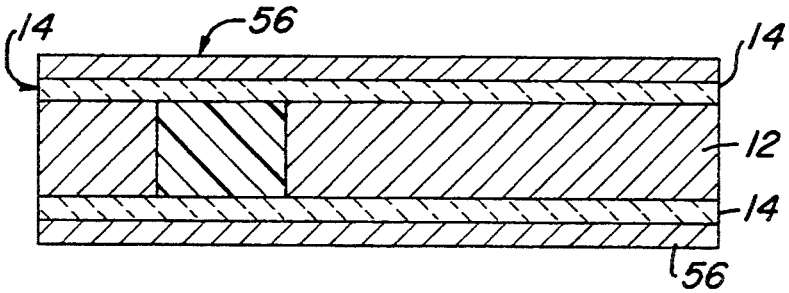

In FIG. 5, plate 50 and plugs 54 have been laminated with a thermally conductive B-stage prepreg film to form dielectric layers 14 thereby covering the major faces of plate 50 and enclosing plate 50 as metal core 12. A layer of copper foil 56 has been laminated on top of each dielectric layer 14. Both the dielectric and copper are laminated simultaneously. The hole fill process FIG. 4 and the lamination of the surface dielectric 14 in FIG. 5 and the copper foil can also be carried out simultaneously. Dielectric layers 14 may be formed from composite materials such as an epoxy or polyimide filled with 50 to 80% by volume with a thermally conductive dielectric such as boron nitride, diamond, aluminum nitride, or a combination of the foregoing materials. Alternative process steps for deposition of coatings of these materials exist.

Aluminum nitride or boron nitride may be low temperature arc vapor deposited. For application of aluminum nitride or boron nitride to a metal surface, a high ion energy (60–100 eV) and high degree of plasma ionization (approximately 90%) are used. This leads to formation of dense, extremely adherent coatings on a metal substrate. In general, the formation of nitride coatings is done through introduction of nitrogen gas into the plasma which interacts with a base material, such as aluminum. Following deposition of the nitride coating, circuitization (i.e. the formation of electrical leads) may be accomplished by sputtering of copper or electroless copper as a seed and subsequent build up of copper using electrolytic plating techniques.

Diamond and diamond-like coating of carbon may be formed by chemical vapor deposition processes which allows for uniform application on the surfaces of the metal plate 50 and in the clearance holes 52. 4 Circuitization is then achieved on the card through sputter deposition of copper seed and electrolytic copper plating.

Figure 6:
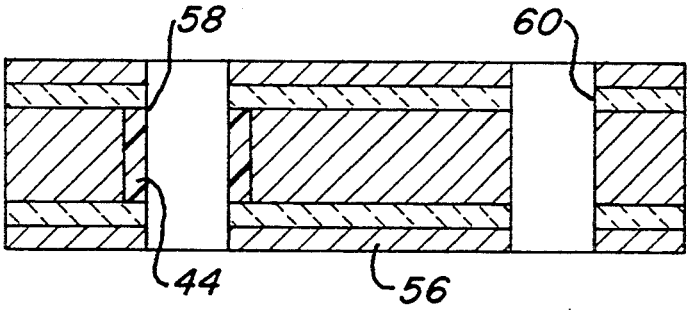

Next, in FIG. 6, clearance holes 58 and 60 have been drilled through the body of the board. Clearance hole 58 is drilled centered on plug 54. However, hole 58 is narrower than plug 54 leaving an insulating collar 44 lining hole 58. Clearance hole 60 is drilled through metal core 12 and is accordingly in contact with the core along its surface. Plasma desmearing may be applied to clean clearance holes 58 and 60 at this point.

Figure 7:
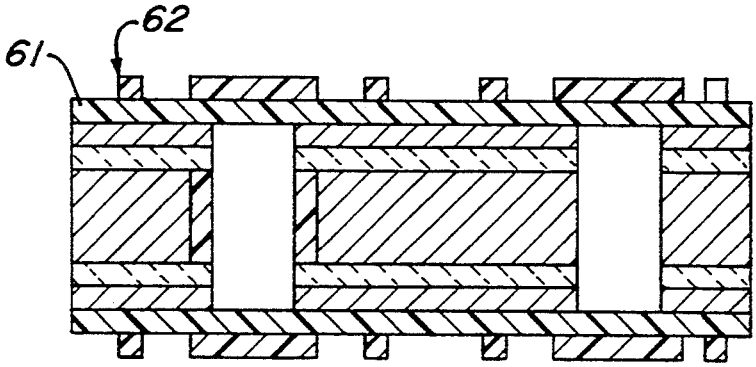

FIG. 7 illustrates application of a layer 61 of photoresist (preferably 0.0010 and 0.0020 inches in depth) and a glass or mylar photomask 62 outlining circuitization paths for the final circuit board 10.

Figure 8:
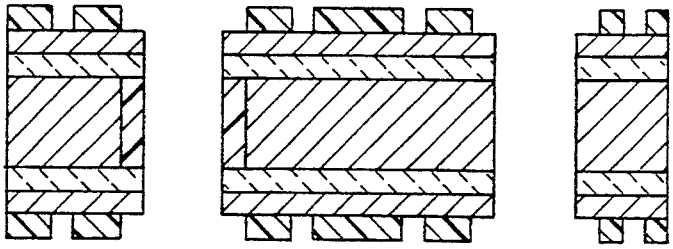

FIG. 8 illustrates the state of the board 10 after the photoresist layer 60 has been exposed to ultraviolet light through the photomask 62, and the unexposed photoresist has been removed with an appropriate solvent.

Figure 9:
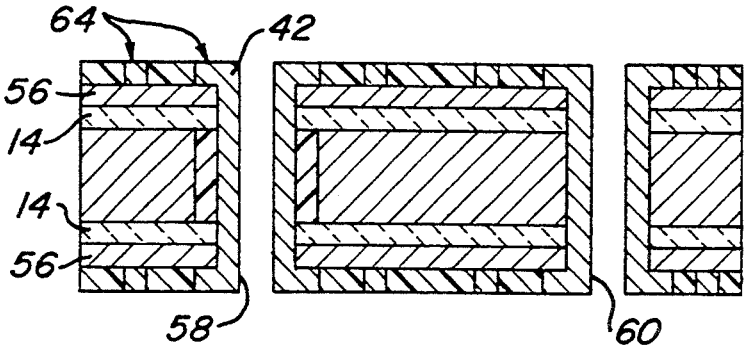
Figure 10:
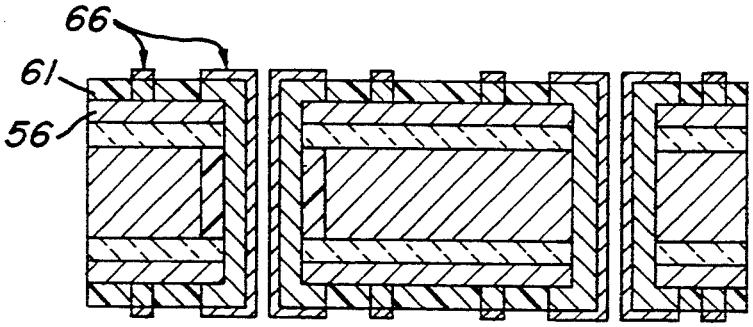

FIG. 9 illustrates a stage of fabrication of board 10 after chemical deposition of seed within clearance holes 58 and 60 followed by electrolytic deposition of copper 64 on the exposed copper foil 56 and in the clearance holes 58 and 60. The layer 28 of electrical leads 20 and copper sleeve 42 are now in place.

In FIG. 1 0, solder plate 66 has been applied to all exposed copper surfaces including within clearance holes 58 and 60.

Figure 11:
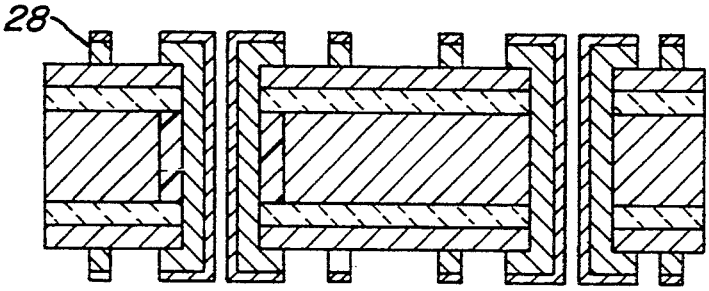

In FIG. 11, all exposed photoresist 60 has been stripped.

Figure 12:
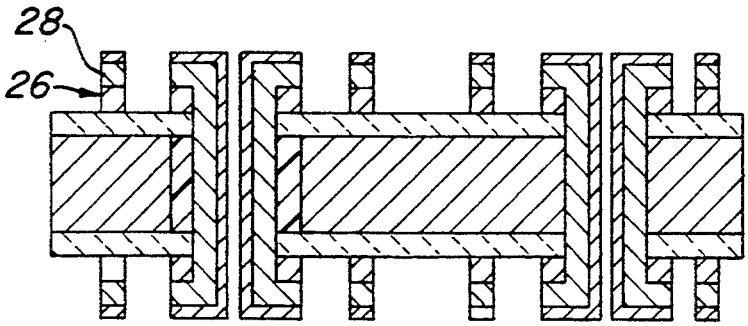

In FIG. 12, all copper foil 56 formerly underlying the exposed photoresist 60 has been removed by chemical etching, leaving bottom layers 26 for electrical leads 20 now in place under layers 28.

Figure 13:
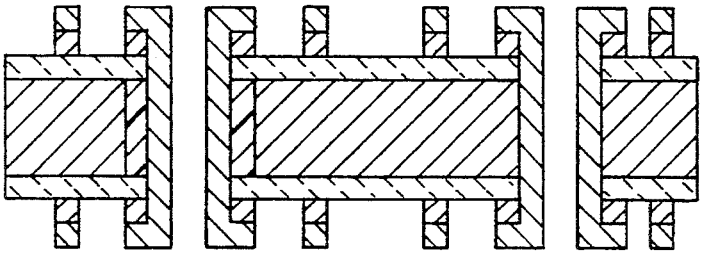

Next, FIG. 13 illustrates board 10 after the solder plate has been stripped. An alternative method for fabricating the electrical leads 20 would be to electrolytically plate copper foil surface 56, and the holes 58 and 60. Then form the desired electrical leads 20 and the plated holes 32 and 34 by a subtractive process (not shown) well known in the art of fabricating circuit boards.

Figure 14:
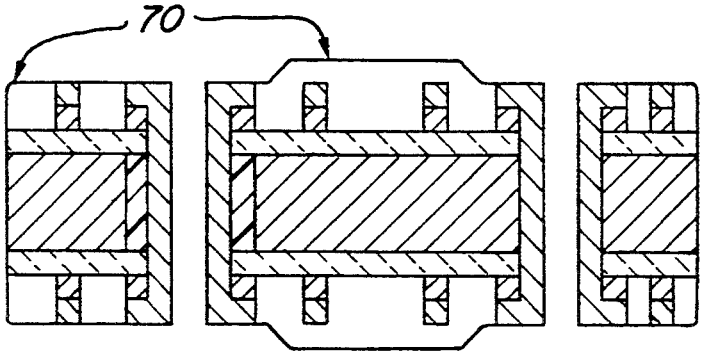

In FIG. 14, a solder mask 70 has been applied to the major faces of the board, exposed to ultraviolet radiation through a photomask (not shown), and developed to provide protective layers 16 and exterior major surfaces 11 and 13. The unexposed solder mask is developed (removed) from copper pads which will then be solder plated or nickel/gold plated.

Figure 15:
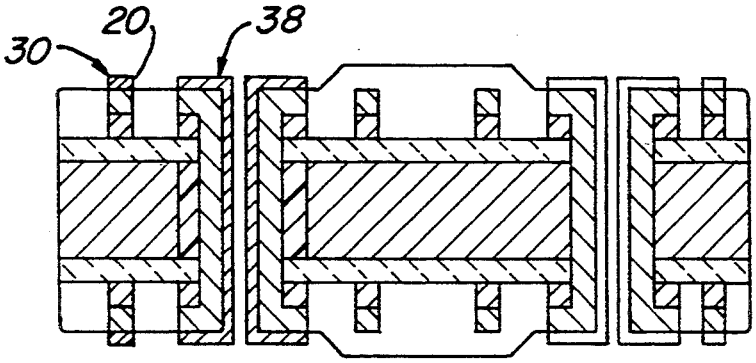

FIG. 15 illustrates a nearly completed board 10 ready to receive devices. Solder plate (0.0010 to 0.0030 inches in thickness) has been deposited to form tubes 38 within vias 32 and 34 and to provide surface mount and pin in hole mounts for devices to be connected to the board. Edge connector pads 30 or direct chip attach pads (not shown) have been completed by the addition of a nickel/gold plating (depth approximately 0.0002 inches).

Circuit boards in accordance with the present invention provide high substrate thermal conductivity, eliminating the need to use separate heat spreaders for many applications. They also allow for via-through-hole, double sided, high density packaging thereby significantly reducing physical card dimensions for power supply applications. Also improved are pin-in-hole and multi-layer packaging capability. The boards are characterized by ability to withstand high voltages before breakdown through the use of high breakdown voltage dielectric material. Both surface conductors and the metal core exhibit low sheet resistance for high current carrying capability. The board allows direct attachment of integrated circuits as well as supporting use of surface mount and pin-in-hole technology. Boards constructed in accordance with the teachings herein exhibit excellent mechanical strength. Applications for the boards include power regulators, converters, motor drivers, print head drivers and heat sinks for computers and other electronic packaging applications.

While the invention has been particularly shown and described with reference to a preferred embodiment, it will be understood by those skilled in the art that various changes in form and detail may be made therein without departing from the spirit and scope of the invention.

What is claimed is:

1. A circuit board comprises:

a metal core having parallel first and second major faces and exhibiting high thermal and electrical conductivity;

dielectric layers of thermally conductive material applied to the first and second major faces of the metal core;

a plurality of insulated and grounded vias through metal core and the dielectric layers;

an electrically conductive sleeve within each insulated and grounded vias, wherein the electrically conductive sleeves in the insulated vias are electrically insulated from the metal core by dielectric material and the electrically conductive sleeves in the grounded vias are in electrical contact to the metal core for grounding; and electrically conductive leads connected to selected ones of the electrically conductive sleeves and applied to each of the dielectric layers and spaced thereby from the metal core,

2. The circuit board of claim 1, wherein the dielectric layers are aluminum nitride, boron nitride, diamond or ceramic polymer composites.

3. The circuit board of claim 2, wherein the metal core is copper, aluminum or anodized aluminum.

4. The circuit board of claim 3, and further comprising:

first and second solder mask layers applied over the conductive leads and dielectric layers and forming outward facing major surfaces of the circuit board; and electronic components mounted to each major surface of the circuit board.

5. The circuit board of claim 1, wherein the dielectric layers are formed of an epoxy or polyimide matrix filled with 50% to 80% by volume with a thermally conductive dielectric.

6. The circuit board of claim 5, where the thermally conductive dielectric is boron nitride, aluminum nitride, diamond, diamond-like carbon or a combination of two or more of the forgoing materials.

* * * * *